US00RE38914E

(19) United States
(12) Reissued Patent
Jang et al.

(10) Patent Number: US RE38,914 E
(45) Date of Reissued Patent: Dec. 6, 2005

(54) DUAL DAMASCENE PATTERNED CONDUCTOR LAYER FORMATION METHOD WITHOUT ETCH STOP LAYER

(75) Inventors: Syun-Ming Jang, Hsin-Chu (TW); Chen-Hua Yu, Hsin-Chu (TW)

(73) Assignee: Taiwan Semiconductor Manufacturing Company, Ltd., Hsin-Chu (TW)

(21) Appl. No.: 10/329,863

(22) Filed: Dec. 26, 2002

Related U.S. Patent Documents

Reissue of:
(64) Patent No.: 6,165,898
Issued: Dec. 26, 2000
Appl. No.: 09/177,187
Filed: Oct. 23, 1998

(51) Int. Cl.[7] ..... H01L 21/3065

(52) U.S. Cl. ..... 438/638; 438/738

(58) Field of Search ..... 438/638, 637, 438/623, 624, 738, 639, 696, 701, 713, 695, 710, 706, 711, 723, 712, 714; 257/759, 760

(56) References Cited

U.S. PATENT DOCUMENTS

| | | | | | |
|---|---|---|---|---|---|
| 5,422,309 | A | * | 6/1995 | Zettler et al. | 437/192 |
| 5,565,384 | A | * | 10/1996 | Havemann | 437/228 |
| 5,635,423 | A | * | 6/1997 | Huang et al. | 437/195 |
| 5,654,240 | A | * | 8/1997 | Lee et al. | 438/647 |
| 5,677,243 | A | * | 10/1997 | Ohsaki | 437/195 |
| 5,741,626 | A | * | 4/1998 | Jain et al. | 430/314 |
| 5,760,480 | A | * | 6/1998 | You et al. | 257/783 |
| 5,795,823 | A | * | 8/1998 | Avanzino et al. | 438/639 |
| 5,882,535 | A | * | 3/1999 | Stocks et al. | 216/18 |

(Continued)

OTHER PUBLICATIONS

Korczynski, "Low–k Dielectric Integration Cost Modeling", Solid State Technology, Oct. 1997, pp. 123–128.

*Primary Examiner*—Amir Zarabian
*Assistant Examiner*—Christy Novacek
(74) *Attorney, Agent, or Firm*—Haynes & Boone, LLP

(57) ABSTRACT

A method for forming a via through a dielectric layer within a microelectronics fabrication. There is first provided a substrate having a contact region formed therein. There is then formed upon the substrate and covering the contact region a blanket first dielectric layer formed of a first dielectric material which is not susceptible to etching with an oxygen containing plasma. There is then formed upon the blanket first dielectric layer a blanket second dielectric layer formed of a second dielectric material which is susceptible to etching within the oxygen containing plasma. There is then formed upon the blanket second dielectric layer a blanket hard mask layer formed from a hard mask material which is not susceptible to etching within the oxygen containing plasma. There is then formed upon the blanket hard mask layer a patterned first photoresist layer which leaves exposed a portion of the blanket hard mask layer greater than and completely overlapping an areal deminsion of a via to be formed through the blanket first dielectric layer to access the contact layer. There is then etched while employing a first plasma etch method the blanket hard mask layer to form a patterned hard mask layer defining a first trench formed through the patterned hard mask layer. There is then etched while employing a second plasma etch method and at least the patterned hard mask layer the blanket second dielectric layer to form a patterned second dielectric layer having a second trench formed therethrough, where the second plasma etch method employs the oxygen containing plasma which preferably simultaneously strips the patterned first photoresist layer. There is then formed over at least the patterned second dielectric layer a patterned second photoresist layer which defines the location of the via to be formed through the blanket first dielectric layer. There is then etched while employing a third plasma etch method and the patterned second photoresist layer as a third etch mask layer the via through the blanket first dielectric layer.

34 Claims, 4 Drawing Sheets

U.S. PATENT DOCUMENTS 5,888,309 A * 3/1999 Yu ..... 134/1.2
6,004,883 A * 12/1999 Yu et al. ..... 438/706
6,228,758 B1 * 5/2001 Pellerin et al. ..... 438/624
6,287,961 B1 9/2001 Liu et al. ..... 438/638
6,297,168 B1 10/2001 Shieh et al. ..... 438/723
6,346,474 B1 2/2002 Liu ..... 438/633
6,372,631 B1 4/2002 Wang et al. ..... 438/624
6,387,798 B1 5/2002 Loke et al. ..... 438/623

* cited by examiner

DUAL DAMASCENE PATTERNED CONDUCTOR LAYER FORMATION METHOD WITHOUT ETCH STOP LAYER

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates generally to methods for forming patterned conductor layers separated by patterned dielectric layers within microelectronics fabrications. More particularly, the present invention relates to dual damascene methods for forming patterned conductor layers separated by patterned dielectric layers within microelectronics fabrications.

2. Description of the Related Art

Microelectronics fabrications are formed from microelectronics substrates over which are formed patterned microelectronics conductor layers which are separated by microelectronics dielectric layers.

As microelectronics integration levels have increased and microelectronics device and patterned conductor layer dimensions have decreased, it has become increasingly common within the art of microelectronics fabrication to employ interposed between the patterns of narrow linewidth dimension and/or narrow pitch dimension patterned microelectronics conductor interconnection layers within microelectronics fabrications microelectronics dielectric layers formed of low dielectric constant dielectric materials. Such patterned microelectronics conductor interconnection layers often access within the microelectronics fabrications within which they are formed patterned microelectronics conductor contact stud layers or patterned microelectronics conductor interconnection stud layers. For the purposes of the present disclosure, low dielectric constant dielectric materials are intended as dielectric materials having a dielectric constant of less than about 3.0. For comparison purposes, dielectric layers formed employing conventional silicon oxide dielectric materials, silicon nitride materials or silicon oxynitride dielectric materials typically have dielectric constants in the range of from about 4.0 to about 7.0.

Microelectronics dielectric layers formed of low dielectric constant dielectric materials are desirable interposed between the patterns of narrow linewidth dimension and/or narrow pitch dimension patterned microelectronics conductor interconnection layers within microelectronics fabrications since such dielectric layers formed from such low dielectric constant dielectric materials provide dielectric layers which assist in providing microelectronics fabrications exhibiting enhanced microelectronics fabrication speed, attenuated patterned microelectronics conductor layer parasitic capacitance, and attenuated patterned microelectronics conductor layer cross-talk.

Low dielectric constant dielectric materials which may be employed for forming low dielectric constant microelectronics dielectric layers within microelectronics fabrications are typically materials with hydrogen and/or carbon content, such as but not limited to organic polymer spin-on-polymer dielectric materials (such as but not limited to polyimide organic polymer spin-on-polymer dielectric materials, polyarylene-ether organic polymer spin-on-polymer dielectric materials, and fluorinated poly-arylene-ether organic polymer spin-on-polymer dielectric materials), amorphous carbon dielectric materials (such as but not limited to amorphous carbon and fluorinated amorphous carbon), and silsesqiuoxane spin-on-glass (SOG) dielectric materials (such as but not limited to hydrogen silsesquioxane spin-on-glass (SOG) dielectric materials, carbon bonded hydrocarbon silsesquioxane spin-on-glass (SOG) dielectric materials, and carbon bonded fluorocarbon silsesquioxane spin-on-glass (SOG) dielectric materials).

While organic polymer spin-on-polymer dielectric materials, amorphous carbon dielectric materials, and silsesquioxane spin-on-glass (SOG) dielectric materials are thus desirable within the art of microelectronics fabrication for forming patterned low dielectric constant microelectronics dielectric layers interposed between the patterns of patterned conductor interconnection layers which access patterned conductor stud layers within microelectronics fabrications, such microelectronics fabrication structures are often not formed entirely without problems. In particular, such microelectronics fabrication structures are typically formed employing an etch stop layer formed interposed between: (1) a patterned first dielectric layer through which is formed a patterned conductor stud layer; and (2) a patterned low dielectric constant dielectric layer which is formed adjoining the patterned conductor interconnection layer which contacts the patterned conductor stud layer. The etch stop layer typically assures optimal definition of the patterned conductor interconnection layer within respect to the patterned conductor stud layer. Unfortunately, the presence of such etch stop layers often provides additional microelectronics fabrication complexity within microelectronics fabrications within which are formed patterned conductor interconnection layers which contact patterned conductor stud layers.

It is thus towards the goal of forming microelectronics fabrication structures comprising patterned low dielectric constant dielectric layers separating patterned conductor interconnection layers which in turn contact patterned conductor stud layers, with attenuated microelectronics fabrication complexity, that the present invention is directed.

Various methods have been disclosed in the art of microelectronics fabrication for forming patterned microelectronics layers within microelectronics fabrications.

For example, Korczynski, in "Low-k dielectric integration cost modelling," Solid State Technology, Oct. 1997, pp. 123–28, discloses in general various methods and materials for forming patterned low dielectric constant dielectric layers interposed between the patterns of patterned conductor interconnection layers which in turn contact patterned conductor stud layers within microelectronics fabrications. Disclosed are standard patterned conductor layer formation and dielectric layer isolation methods and dual damascene patterned conductor layer formation and dielectric layer isolation methods.

In addition, Zettler et al., in U.S. Pat. No. 5,422,309, discloses a two step photolithographic method for forming within a dielectric layer within an integrated circuit a patterned conductor contact stud layer contiguous with a patterned conductor interconnection layer within the integrated circuit. Within the first step of the two step photolithographic method there is formed a series of vias within the dielectric layer, while within the second step of the two step photolithographic method there is formed within the dielectric layer a series of trenches contiguous with the series of vias through the dielectric layer, where a photoresist layer employed in defining the trenches within the second step of the two step method fills the vias formed within the first step of the two step method.

Further, Havemann, in U.S. Pat. No. 5,565,384, discloses a method for forming within an integrated circuit microelectronics fabrication a self-aligned via through an inorganic dielectric layer to access a patterned conductor layer formed below the inorganic dielectric layer, where the patterned conductor layer has interposed at least partially between its patterns an organic containing dielectric layer. The patterned conductor layer and the organic dielectric layer are completely covered by the inorganic dielectric layer. The method employs an anisotropic etchant which is selective to the inorganic dielectric layer with respect to the organic dielectric layer, such that the organic dielectric layer service as an etch stop layer when etching the self-aligned via through the inorganic dielectric layer, thus avoiding overetching of the organic dielectric layer.

Yet further, Huang et al., in U.S. Pat. No. 5,635,423, also discloses a dual damascene method for forming a patterned conductor interconnection layer contiguous with a patterned conductor stud layer within a semiconductor integrated circuit microelectronics fabrication. The dual damascene method employs a blanket mask layer formed interposed between a lower dielectric layer through which is formed the patterned conductor stud layer and an upper dielectric layer through which is formed the patterned conductor interconnection layer contiguous with the patterned conductor stud layer, where the upper dielectric layer and the lower dielectric layer are sequentially patterned employing separate reactive ion etch (RIE) methods.

Still yet further, Lee et al., in U.S. Pat. No. 5,654,240, discloses a method for fabricating a patterned polycide direct contact layer upon a semiconductor substrate with attenuated trenching within the semiconductor substrate. The method employs a patterned polysilicon layer formed upon a patterned dielectric layer over a semiconductor substrate, where there is formed upon the patterned polysilicon layer a blanket metal silicide layer having formed thereupon a blanket hard mask layer, where in turn a patterned hard mask layer formed from the blanket hard mask layer is employed in forming a patterned metal silicide layer from the blanket metal silicide layer.

Finally Ohsaki, in U.S. Pat. No. 5,677,243, discloses a two-step photolithographic method for forming within a dielectric layer within an integrated circuit a patterned conductor contact layer contiguous with a patterned conductor interconnection layer within the integrated circuit. Within a first step within the two-step photolithographic method there is formed a via through the dielectric layer to access a contact layer within the integrated circuit and within a second step within the two-step photolithographic method there is formed within the dielectric layer a trench which is contiguous with the via, where during the second step the via has formed therein a sacrificial organic material layer.

Desirable in the art of microelectronics fabrication are methods through which there may be formed within microelectronics fabrications low dielectric constant dielectric layers interposed between the patterns of patterned conductor interconnection layers which in turn contact patterned conductor stud layers, with attenuated process complexity.

It is toward the foregoing object that the present invention is both generally and more specifically directed.

SUMMARY OF THE INVENTION

A first object of the present invention is to provide a method for forming within a microelectronics fabrication a patterned low dielectric constant dielectric layer adjoining a patterned conductor interconnection layer which in turn contacts a patterned conductor stud layer.

A second object of the present invention is to provide a method in accord with the first object of the present invention, where the method provides for attenuated process complexity.

A third object of the present invention is to provide a method in accord with the first object of the present invention or the second object of the present invention, where the microelectronics fabrication is a semiconductor integrated circuit microelectronics fabrication.

A fourth object of the present invention is to provide a method in accord with the first object of the present invention, the second object of the present invention or the third object of the present invention, which method is readily commercially implemented.

In accord with the objects of the present invention, there is provided a method for forming a via through a dielectric layer within a microelectronics fabrication. To practice the method, there is first provided a substrate employed within a microelectronics fabrication, where the substrate has a contact region formed therein. There is then formed upon the substrate and covering the contact region a blanket first dielectric layer. The blanket first dielectric layer is formed of a first dielectric material which is not susceptible to etching with an oxygen containing plasma. There is then formed upon the blanket first dielectric layer a blanket second dielectric layer. The blanket second dielectric layer is formed of a second dielectric material which is susceptible to etching within the oxygen containing plasma. There is then formed upon the blanket second dielectric layer a blanket hard mask layer. The blanket hard mask layer is formed from a hard mask material which is not susceptible to etching within the oxygen containing plasma. There is then formed upon the blanket hard mask layer a patterned first photoresist layer. The patterned first photoresist layer leaves exposed a portion of the blanket hard mask layer greater than a completely overlapping an areal deminsion of a via to be formed through the blanket first dielectric layer to access the contact layer. There is then etched while employing a first plasma etch method the blanket hard mask layer to form a patterned hard mask layer defining a first trench formed through the patterned hard mask layer, while employing the patterned photoresist layer as a first etch mask layer. The first plasma etch method employs a first etchant gas composition appropriate to the hard mask material from which is formed the blanket hard mask layer. There is then etched while employing a second plasma etch method and at least the patterned hard mask layer as a second etch mask layer the blanket second dielectric layer to form a patterned second dielectric layer having a second trench formed therethrough at a location corresponding with the first trench formed through the blanket hard mask layer. The second plasma etch method employs the oxygen containing plasma. There is then formed over at least the patterned second dielectric layer a patterned second photoresist layer which defines the location of the via to be formed through the blanket first dielectric layer. The areal deminsion of the via is contained within the areal deminsion of the second trench. Finally, there is then etched while employing a third plasma etch method and the patterned second photoresist layer as a third etch mask layer the via through the blanket first dielectric layer. The third plasma etch method employs a third etchant gas composition appropriate to the first dielectric material.

There may then be formed within at least the via and the second trench while employing a damascene method a patterned conductor interconnection layer contiguous with a patterned conductor stud layer.

The present invention provides a method for forming within a microelectronics fabrication a patterned low dielectric constant dielectric layer adjoining a patterned conductor interconnection layer which in turn contacts a patterned conductor stud layer, where the method provides for attenuated process complexity. The method of the present invention realizes the foregoing objects by employing when forming the patterned low dielectric constant dielectric layer a low dielectric constant dielectric material which is etchable within an oxygen containing plasma. The patterned low dielectric constant dielectric layer so formed is formed upon a blanket first dielectric layer which is not etchable within the oxygen containing plasma, where there is subsequently formed through the blanket first dielectric layer a via accessing a contact region within a substrate layer formed beneath the blanket first dielectric layer. Thus, when employing an appropriate hard mask layer and an oxygen containing plasma etch method employing the oxygen containing plasma, there may be formed without employing an etch stop layer interposed between the blanket first dielectric layer and the blanket low dielectric constant dielectric layer a trench through the blanket low dielectric constant dielectric layer and when employing a second pattern photoresist layer and a third plasma etch method a via through the blanket first dielectric layer, where the areal deminsion of the via is contained within the areal deminsion of the trench. There may then be formed into the via and the trench while employing a damascene method a patterned planarized contiguous conductor interconnection and conductor stud layer. Thus, the present invention provides a method for forming within a microelectronics fabrication a patterned low dielectric constant dielectric layer adjoining a patterned conductor interconnection layer which in turn contacts and is contiguous with a patterned conductor stud layer, where the method provides for attenuated process complexity.

The present invention may be employed where the microelectronics fabrication is a semiconductor integrated circuit microelectronics fabrication. The present invention does not discriminate with respect to the nature of a microelectronics fabrication within which is formed a patterned low dielectric constant dielectric layer interposed between the patterns of a patterned conductor interconnection layer which in turn contacts a patterned conductor stud layer. Thus, although the method of the present invention may be employed when forming patterned low dielectric constant dielectric layers interposed between the patterns of patterned conductor interconnection layers which in turn contact patterned conductor stud layers within semiconductor integrated circuit microelectronics fabrications, the method of the present invention may also be employed in forming patterned low dielectric constant dielectric layers interposed between the patterns of patterned conductor interconnection layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

The present invention is readily commercially implemented. The present invention employs methods and materials which are otherwise generally known in the art of microelectronics fabrication. Since it is a novel ordering and use of methods and materials which provides the method of the present invention, rather than the existence of the methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method for forming within a microelectronics fabrication a patterned low dielectric constant dielectric layer adjoining a patterned conductor interconnection layer which in turn contacts a patterned conductor stud layer, where the method provides for attenuated process complexity. The method of the present invention realizes the foregoing objects by employing when forming the patterned low dielectric constant dielectric layer a low dielectric constant dielectric material which is etchable within an oxygen containing plasma. The patterned low dielectric constant dielectric layer so formed is formed upon a blanket first dielectric layer which is not etchable within the oxygen containing plasma, where there is subsequently formed through the blanket first dielectric layer a via accessing a contact region within a substrate layer formed beneath the blanket first dielectric layer. Thus, when employing an appropriate hard mask layer and an oxygen containing plasma etch method employing the oxygen containing plasma, there may be formed without employing an etch stop layer interposed between the blanket first dielectric layer and the blanket low dielectric constant dielectric layer a trench through the blanket low dielectric constant dielectric layer and when employing a second patterned photoresist layer and a third plasma etch method a via through the blanket first dielectric layer, where the areal deminsion of the via is contained within the areal deminsion of the trench. There may then be formed into the via and the trench while employing a damascene method a patterned planarized contiguous conductor interconnection and conductor stud layer.

The present invention does not discriminate with respect to the nature of a microelectronics fabrication within which is formed a patterned low dielectric constant dielectric layer interposed between the patterns of a patterned conductor interconnection layer which in turn contacts a patterned conductor stud layer. Thus, although the method of the present invention may be employed when forming patterned low dielectric constant dielectric layers interposed between the patterns of patterned conductor interconnection layers which in turn contact patterned conductor stud layers within semiconductor integrated circuit microelectronics fabrications, the method of the present invention may also be employed in forming patterned low dielectric constant dielectric layers interposed between the patterns of patterned conductor interconnection layers which in turn contact patterned conductor stud layers within microelectronics fabrications including but not limited to semiconductor integrated circuit microelectronics fabrications, solar cell microelectronics fabrications, ceramic substrate microelectronics fabrications and flat panel display microelectronics fabrications.

Figure 1:
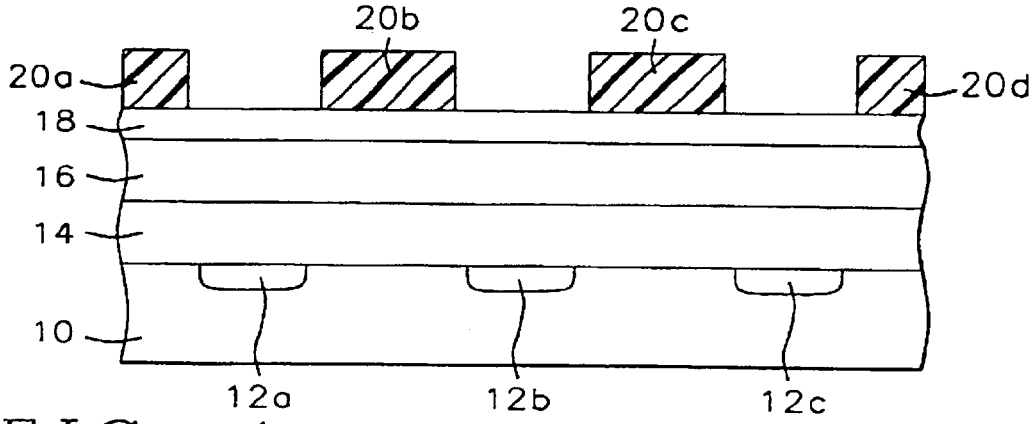
FIG. 1, 2, 3a, 3b, 4, 5a, 5b, 6, 7, and 8 show a series of schematic cross-sectional and plan-view diagrams illustrating the results of forming within a microelectronics fabrication in accord with a preferred embodiment of the present invention two series of patterned low dielectric constant dielectric layers interposed between two series of patterned conductor interconnection layers which in turn contact two series of patterned conductor stud layers, in accord with the method of the present invention.

Referring now to FIG. 1 to FIG. 8, there is shown a series of schematic cross-sectional and plan-view diagrams illustrating the results of forming within a microelectronics fabrication in accord with a preferred embodiment of the present invention two series of patterned low dielectric constant dielectric layers interposed between two series of patterned conductor interconnection layers which in turn contact two series of patterned conductor stud layers, formed in accord with the method of the present invention. Shown in FIG. 1 is a schematic cross-sectional diagram of the microelectronics fabrication at an early stage in its fabrication in accord with the method of the present invention.

Shown in FIG. 1 is a substrate 10 employed within a microelectronics fabrication, where the substrate 10 has formed therein a series of contact regions 12a, 12b, and 12c. Within the preferred embodiment of the present invention, the substrate 10 may be a substrate employed within a microelectronics fabrication including but not limited to a semiconductor integrated circuit microelectronics fabrication, a solar cell microelectronics fabrication, a ceramic substrate microelectronics fabrication or a flat panel display microelectronics fabrication. Although not specifically illustrated within the schematic cross-sectional diagram of FIG. 1, the substrate 10 may be the substrate itself employed within the microelectronics fabrication, or in the alternative, the substrate 10 may be the substrate employed within the microelectronics fabrication, where the substrate has any of several additional layers formed thereupon or thereover as are conventional within the microelectronics fabrication within which is employed the substrate. Such additional microelectronics layers may include, but are not limited to, microelectronics conductor layers, microelectronics semiconductor layers and microelectronics dielectric layers.

With respect to the contact regions 12a, 12b, and 12c formed within the substrate 10, the contact regions 12a, 12b, and 12c will typically and preferably, although not exclusively, be either conductor contact regions or semiconductor contact regions within the microelectronics fabrication within which is employed the substrate 10. More preferably, when within the present invention the substrate 10 is a semiconductor substrate alone employed within a semiconductor integrated circuit microelectronics fabrication, the contact regions 12a, 12b, and 12c are semiconductor substrate contact regions which are typically employed when forming semiconductor integrated circuit devices employing the substrate 10.

Shown also within FIG. 1 formed upon the substrate 10 is a blanket first dielectric layer 14 covering the substrate 10 including the series of contact regions 12a, 12b, and 12c. Within the preferred embodiment of the present invention, the blanket first dielectric layer 14 is formed of a first dielectric material which is not susceptible to etching within an oxygen containing plasma. Many dielectric materials which possess this property are known in the art of microelectronics fabrication, such dielectric materials including but not limited to silicon oxide dielectric materials, silicon nitride dielectric materials, and silicon oxynitride dielectric materials which may be formed employing methods including but not limited to chemical vapor deposition (CVD) methods, plasma enhanced chemical vapor deposition (PECVD) methods and physical vapor deposition (PVD) sputtering methods. Thus, although other methods and materials may be employed, the blanket first dielectric layer 14 is preferably formed of a silicon oxide dielectric material deposited employing a chemical vapor deposition (CVD) method, as is conventional in the art of microelectronics fabrication. Preferably, the blanket first dielectric layer 14 so formed is formed to a thickness of from about 5000 to about 9000 angstroms.

Also shown in FIG. 1 formed upon the blanket first dielectric layer 14 is a blanket second dielectric layer 16. Within the preferred embodiment of the present invention, the blanket second dielectric layer 16 is formed of a second dielectric material which is susceptible to etching within the oxygen containing plasma within which the blanket first dielectric layer 14 is not susceptible to etching. For the purposes of defining an extent to which the blanket first dielectric layer 14 is not susceptible to etching within the oxygen containing plasma while the blanket second dielectric layer 16 is susceptible to etching within the oxygen containing plasma, the blanket second dielectric layer 16 preferably has an etch rate ratio within the oxygen containing plasma with respect to the blanket first dielectric layer 14 of greater than about 30:1, more preferably greater than about 40:1, and most preferably greater than about 50:1. Although not specifically illustrated within the schematic cross-sectional diagrams of FIG. 1, the blanket second dielectric layer 16 may optionally, if desirable, be planarized employing an appropriate planarizing method.

Within the preferred embodiment of the present invention, the blanket second dielectric layer 16, which is formed of the second dielectric material which is susceptible to etching within the oxygen containing plasma, is preferably formed of a low dielectric constant dielectric material selected from the group including but not limited to organic polymer spin-on-polymer dielectric materials (such as but not limited to polyimide organic polymer spin-on-polymer dielectric materials, poly-arylene-ether organic polymer spin-on-polymer dielectric materials and fluorinated poly-arylene-ether organic polymer spin-on-polymer dielectric materials) and amorphous carbon dielectric materials (such as but not limited to amorphous carbon and fluorinated amorphous carbon). Preferably, the blanket second dielectric layer 16 is formed to a thickness of from about 5000 to about 9000 angstroms.

There is also shown in FIG. 1 a blanket first hard mask layer 18 formed upon the blanket second dielectric layer 16. Within the preferred embodiment of the present invention, the blanket first hard mask layer 18 is formed of a hard mask material which is also not susceptible to etching within the oxygen containing plasma. Similarly with the blanket first dielectric layer 14, there are several methods and materials which may be employed in forming the blanket first hard mask layer 18, where such methods and materials include but are not limited to thermally assisted evaporation methods, electron beam assisted evaporation methods, chemical vapor deposition (CVD) methods and physical vapor deposition (PVD) sputtering methods which may be employed for forming blanket hard mask layers from hard mask materials including but not limited to conductor hard mask materials, semiconductor hard mask materials, and insulator hard mask materials. Although the blanket first hard mask layer 18 may be formed employing any of several such methods and materials as are known in the art of microelectronics fabrication, the blanket first hard mask layer 18 is typically and preferably formed of a hard mask material analogous or equivalent to the dielectric material from which is formed the blanket first dielectric layer 14. Preferably, the blanket first hard mask layer 18 so formed is formed to a thickness of from about 1000 to about 3000 angstroms.

Finally, there is also shown in FIG. 1 the presence of a series of patterned first photoresist layers 20a, 20b, 20c, and 20d formed upon the blanket first hard mask layer 18. Within the preferred embodiment of the present invention, the patterned first photoresist layers 20a, 20b, 20c, and 20d may be formed from any of several photoresist materials as are generally known in the art of microelectronics fabrication, including photoresist materials selected from the general groups of photoresist materials including but not limited to positive photoresist materials and negative photoresist materials. For the preferred embodiment of the present invention, the patterned first photoresist layers 20a, 20b, 20c, and 20d are preferably formed of a positive photoresist material as is conventional in the art of microelectronics fabrication, in order to assure optimal dimensional stability. Preferably, the patterned first photoresist layers 20a, 20b, 20c, and 20d so formed are each formed to a thickness of from about 3000 to about 6000 angstroms.

Figure 2:
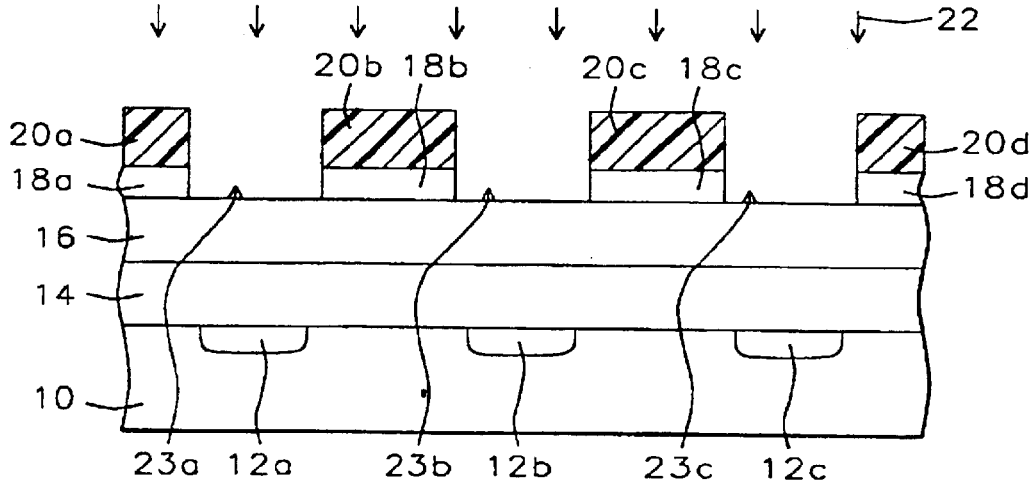

Referring now to FIG. 2, there is shown a schematic cross-sectional diagram illustrating the results of further processing of the microelectronics fabrication whose schematic cross-sectional diagram is illustrated in FIG. 1. Shown in FIG. 2 is a schematic cross-sectional diagram of a microelectronics fabrication otherwise equivalent to the microelectronics fabrication whose schematic cross-sectional diagram is illustrated in FIG. 1, but wherein the blanket first hard mask layer 18 has been patterned to form a series of patterned first hard mask layers 18a, 18b, 18c, and 18d defining a series of first trenches 23a, 23b and 23c, through etching while employing a first plasma 22 in conjunction with the patterned first photoresist layers 20a, 20b, 20c, and 20d as a first etch mask layer. Within the preferred embodiment of the present invention, the first plasma 22 preferably employs an etchant gas composition appropriate to the material from which is formed the blanket first hard mask layer 18. When the blanket first hard mask layer 18 is formed from a silicon oxide dielectric material, as is preferred within the preferred embodiment of the present invention, the first plasma 22 preferably employs a fluorine containing (such as but not limited to fluorocarbon containing) etchant gas composition. Under such circumstances, the first plasma 22 more preferably employs a difluoromethane (CH2F2), hexafluoroethane (C2F6), octafluorocyclobutane (C4F8), argon and oxygen containing etchant gas composition.

Preferably, the first plasma 22 so formed is employed within a first plasma etch method which also employs: (1) a reactor chamber pressure of from about 5 to about 11 mtorr; (2) a source radio frequency power of from about 500 to about 1000 watts at a radio frequency of 13.56 MHZ; (3) a bias power of from about 500 to about 1000 watts; (4) a substrate 10 temperature of from about 100 to about 200 degrees centigrade; (5) difluoromethane flow rate of from about 5 to about 15 standard cubic centimeters per minute (sccm); (6) a hexafluoromethane flow rate of from about 10 to about 20 standard cubic centimeters per minute (sccm); (7) an octafluorocyclobutane flow rate of from about 4 to about 10 standard cubic centimeters per minute (sccm); (8) an argon flow rate of from about 50 to about 150 standard cubic centimeters per minute (sccm); and (9) an oxygen flow rate of from about 3 to about 10 standard cubic centimeters per minute (sccm), for a time sufficient to form from the blanket first hard mask layer 18 the corresponding series of patterned first hard mask layers 18a, 18b, 18c and 18d which define the series of first trenches 23a, 23b and 23c.

Figure 3A:
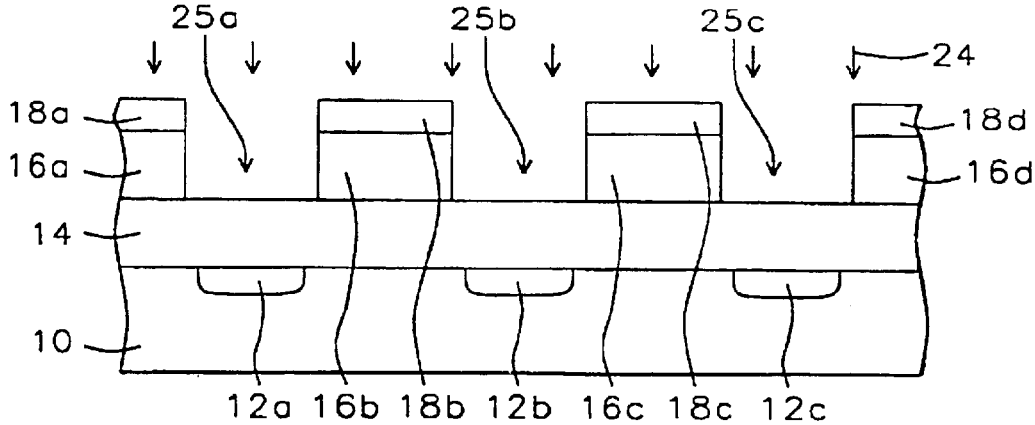

Referring now to FIG. 3a, there is shown a schematic cross-sectional diagram illustrating the results of further processing of the microelectronics fabrication whose schematic cross-sectional diagram is illustrated in FIG. 2. Shown in FIG. 3a is a schematic cross-sectional diagram of a microelectronics fabrication otherwise equivalent to the microelectronics fabrication whose schematic cross-sectional diagram is illustrated in FIG. 2, but wherein: (1) the patterned first photoresist layers 20a, 20b, 20c, and 20d are stripped from the microelectronics fabrication; and (2) the blanket second dielectric layer 16 is patterned to form the patterned second dielectric layers 16a, 16b, 16c, and 16d, while simultaneously defining a series of second trenches 25a, 25b, and 25c which expose portions of the blanket first dielectric layer 14, while employing a second plasma 24 and at least the patterned hard mask layers 18a, 18b 18c, and 18d as a second etch mask layer.

Within the preferred embodiment of the present invention, the second plasma 24 is the oxygen containing plasma within which neither the blanket first dielectric layer 14 nor the blanket first hard mask layer 18 is susceptible to etching, but wherein the blanket second dielectric layer 16 is susceptible to etching.

Within the preferred embodiment of the present invention, the second plasma 24 preferably employs an oxygen containing etchant gas composition comprising an oxygen containing etchant gas selected from the group including but not limited to oxygen, ozone, nitrous oxide and nitric oxide. More preferably, the second plasma 24 employs an oxygen containing etchant gas comprising oxygen along with argon, where argon is employed at a sputter gas component.

Preferably, the second plasma 24 is employed within a second plasma etch method which also employs: (1) a reactor chamber pressure of from about 10 to about 20 mtorr; (2) a radio frequency source power of from about 2500 to about 3500 watts at a radio frequency of 13.56 MHZ; (3) a bias power of from about 200 to about 400 watts; (4) a substrate 10 temperature of from about 100 to about 250 degrees centigrade; (5) an oxygen flow rate of from about 10 to about 30 standard cubic centimeters per minute (sccm); and (6) an argon flow rate of from about 10 to about 30 standard cubic centimeters per minute (sccm).

Within the preferred embodiment of the present invention where the patterned first photoresist layers 20a, 20b, 20c, and 20d are stripped from the microelectronics fabrication whose schematic cross-sectional diagram is illustrated in FIG. 2 simultaneously with etching the blanket second dielectric layer 16 to form the patterned second dielectric layers 16a, 16b, 16c, and 16d, there is preferably employed within the preferred embodiment of the present invention a thickness of the patterned first photoresist layers 20a, 20b, 20c, and 20d such that the patterned first photoresist layers 20a, 20b, 20c, and 20d are completely stripped from the corresponding patterned first hard mask layers 18a, 18b, 18c, and 18d without need for overetching the series of patterned second dielectric layers 16a, 16b, 16c, and 16d. Under such circumstances, optimal lateral dimensional integrity of the series of patterned second dielectric layers 16a, 16b, 16c, and 16d is facilitated. Similarly, the use of the argon sputtering gas component within the second plasma 24 also assists in facilitating optimal lateral dimensional integrity of the patterned second dielectric layers 16a, 16b, 16c, and 16d.

Although it is theoretically plausible to strip, through use of a wet chemical stripper, the patterned first photoresist layers 20a, 20b, 20c and 20d from the microelectronics fabrication whose schematic cross-sectional diagram is illustrated in FIG. 2 prior to etching the blanket second dielectric layer 16 to form the patterned second dielectric layers 16a, 16b, 16c and 16d while employing the second plasma 24, such is generally not practicably possible or preferred since it is often difficult to obtain a wet chemical stripper which selectively removes the patterned photoresist layers 20a, 20b, 20c and 20d without damaging the blanket second dielectric layer.

Figure 3B:
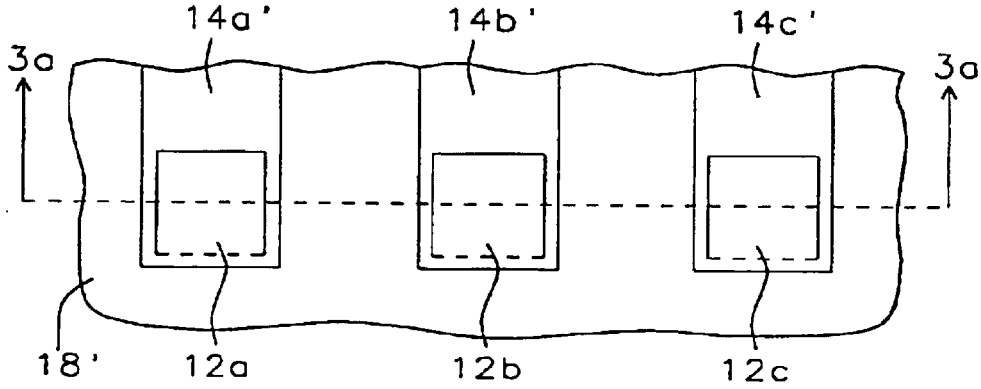

Referring now to FIG. 3b, there is shown a schematic plan-view diagram corresponding with the schematic cross-sectional diagram illustrated within FIG. 3a. Shown in FIG. 3b is the patterned first hard mask layer 18', having formed therein the series of first trenches and the series of second trenches which leave exposed at their bottoms a series of trench floor regions of the blanket first dielectric layer 14a', 14b' and 14c'. As is also illustrated within the schematic plan-view diagram of FIG. 3a, the areal deminsions of each of the series of the trench floor regions of the blanket first dielectric layer 14a', 14b' and 14c' has contained therein an areal deminsion of each of the corresponding contact regions 12a, 12b or 12c.

Figure 4:
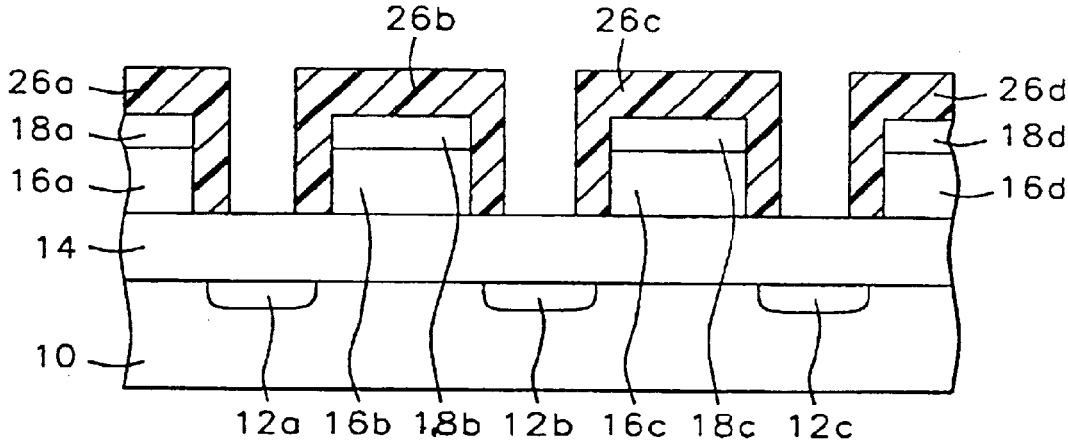

Referring now to FIG. 4, there is shown a schematic cross-sectional diagram illustrating the results of further processing of the microelectronics fabrication whose schematic cross-sectional diagram is illustrated in FIG. 3a. Shown in FIG. 4 is a schematic cross-sectional diagram of a microelectronics fabrication otherwise equivalent to the microelectronics fabrication whose schematic cross-sectional diagram is illustrated in FIG. 3a, but wherein there is formed upon the series of patterned second dielectric layers 16a, 16b, 16c and 16d and the corresponding series of patterned hard mask layers 18a, 18b, 18c and 18d a series of patterned second photoresist layers 26a, 26b, 26c and 26d. As is illustrated in part within the schematic cross-sectional diagram of FIG. 4, the patterned second photoresist layers 26a, 26b, 26c and 26d are formed completely covering the series of patterned hard mask layers 18a, 18b, 18c and 18d and the corresponding series of patterned second dielectric layers 16a, 16b, 16c and 16d. Although not completely illustrated within the schematic cross-sectional diagram of FIG. 4, the patterned photoresist layers 26a, 26b, 26c and 26d leave exposed a series of portions of the blanket first dielectric layer 14 through which there is desired to form a corresponding series vias accessing the series of contact regions 12a, 12b and 12c.

Figure 5A:
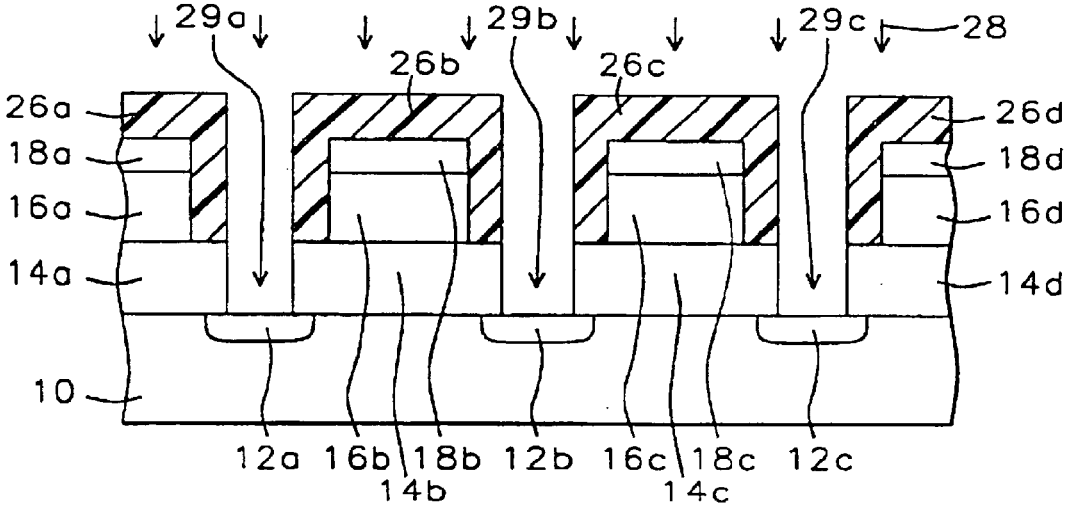

Referring now to FIG. 5a, there is shown a schematic cross-sectional diagram illustrating the results of further processing of the microelectronics fabrication whose schematic cross-sectional diagram is illustrated in FIG. 4. Shown in FIG. 5a is a schematic cross-sectional diagram of a microelectronics fabrication otherwise equivalent to the microelectronics fabrication whose schematic cross-sectional diagram is illustrated in FIG. 4, but wherein the blanket first dielectric layer 14 has been patterned to form the patterned first dielectric layers 14a, 14b, 14c and 14d defining a series of first vias 29a, 29b and 29c, through use of a third plasma etch method employing a third plasma 28, while simultaneously employing the patterned second photoresist layers 26a, 26b, 26c and 26d as a third etch mask layer. Within the preferred embodiment of the present invention, the third plasma 28 preferably employs an etchant gas composition appropriate for etching the blanket first dielectric layer 14, which when the blanket first dielectric layer 14 is formed of a silicon oxide dielectric material as is preferred within the preferred embodiment of the present invention is preferably a fluorine containing etchant gas composition. More preferably, the third plasma 28 employs an etchant gas composition comprising difluoromethane, hexafluoroethane, octafluorocyclobutane, argon and oxygen.

Preferably, the third plasma 28 is employed within a third plasma etch method which employs conditions analogous or equivalent to the conditions employed within the first plasma etch method within which is employed the first plasma 22, including: (1) a reactor chamber pressure of from about 5 to about 15 torr; (2) a source radio frequency power of from about 500 to about 1000 watts at a radio frequency of 13.56 MHZ; (3) a bias power of from about 500 to about 1000 watts; (4) a substrate 10 temperature of from about 100 to about 200 degrees centigrade; (5) a difluoromethane flow rate of from about 5 to about 15 standard cubic centimeters per minute (sccm); (6) a hexafluoroethane flow rate of from about 10 to about 20 standard cubic centimeters per minute (sccm); (7) an octafluorocyclobutane flow rate of from about 4 to about 10 standard cubic centimeters per minute (sccm); (8) an argon flow rate of from about 50 to about 150 standard cubic centimeters per minute (sccm); and (9) an oxygen flow rate of from about 3 to about 10 standard cubic centimeters per minute (sccm), for a time period sufficient to completely etch through the blanket first dielectric layer 14 when forming the patterned first dielectric layers 14a, 14b, 14c and 14d to form the series of first vias 29a, 29b and 29c which simultaneously reach the contact regions 12a, 12b and 12c.

Figure 5B:
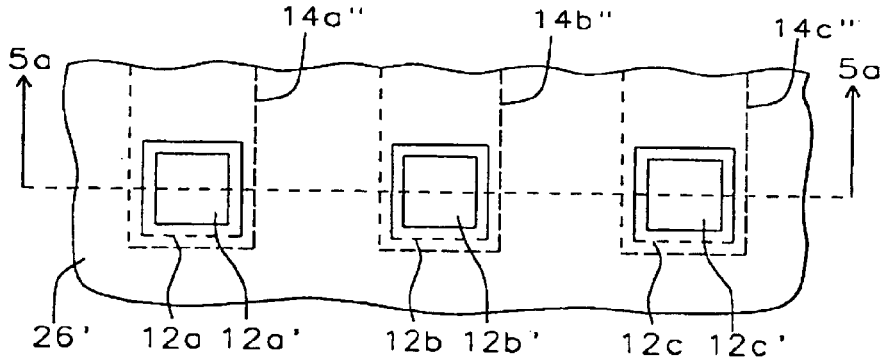

Referring now to FIG. 5b, there is shown a schematic plan-view diagram corresponding with the schematic cross-sectional diagram of FIG. 5a. There is shown in FIG. 5b the patterned second photoresist layer 26' employed in forming the series of first vias which access the via floor regions of the contact regions 12a', 12b' and 12c'. Also shown in FIG. 5b are outlines of the contact regions 12a, 12b and 12c, and outlines of the trench floor regions of the blanket first dielectric layer 14a", 14b" and 14c".

Figure 6:
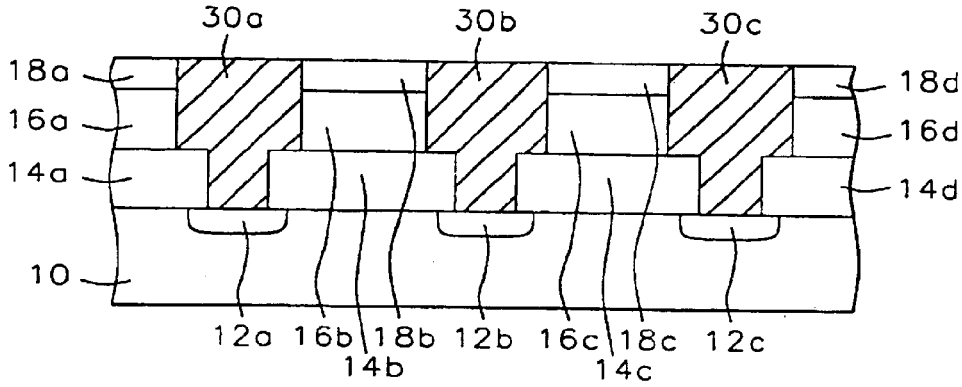

Referring now to FIG. 6, there is shown a schematic cross-sectional diagram illustrating the results of further processing of the microelectronics fabrication whose schematic cross-sectional diagram is illustrated in FIG. 5a. Shown in FIG. 6 is a schematic cross-sectional diagram of a microelectronics fabrication otherwise equivalent to the microelectronics fabrication whose schematic cross-sectional diagram is illustrated in FIG. 5a, but wherein in part the patterned second photoresist layers 26a, 26b, 26c and 26d have been stripped from the microelectronics fabrication. The patterned second photoresist layers 26a, 26b, 26c and 26d may be stripped from the microelectronics fabrication whose schematic cross-sectional diagram is illustrated in FIG. 5a to provide in part the microelectronics fabrication whose schematic cross-sectional diagram is illustrated in FIG. 6 through use of methods as are conventional in the art of microelectronics fabrication. Such methods include but are not limited to wet chemical etch methods and dry oxygen containing plasma etch methods, although dry oxygen containing plasma etch methods are generally substantially preferred since there exists with such methods a reduced susceptibility for damage to the sidewalls of the patterned second dielectric layers 16a, 16b, 16c and 16d.

There is also shown in FIG. 6 the presence of a series of patterned planarized contiguous conductor interconnection and contact stud layers 30a, 30b and 30c formed contiguously into: (1) the series of first vias defined by the patterned first dielectric layers 14a, 14b, 14c and 14d; (2) the series of second trenches defined by the patterned second dielectric layers 16a, 16b, 16c and 16d; and (3) the series of third trenches defined by the patterned hard mask layers 18a, 18b, 18c and 18d. The series of patterned planarized contiguous conductor interconnection and contact stud layers 30a, 30b and 30c is formed employing a damascene method employing conductor materials as are conventional in the art of microelectronics fabrication. The damascene method employs a blanket layer of conductor material which may be deposited employing methods including but not limited to thermally assisted evaporation methods, electron beam assisted evaporation methods, chemical vapor deposition (CVD) methods and physical vapor deposition (PVD) methods to form the blanket layer of conductor material selected from the group of conductor materials including but not limited to metals, metal alloys, doped polysilicon and polycides (doped polysilicon/metal silicide stacks). Within the damascene method the blanket layer of conductor material is preferably polished employing polishing methods, such as but not limited to chemical mechanical polish (CMP) and lapping methods, as are conventional in the art of microelectronics fabrication.

For the preferred embodiment of the present invention, the patterned planarized contiguous conductor interconnection and contact stud layers 30a, 30b and 30c are preferably formed of a tungsten material, beneath which is formed a barrier material layer, as is common within the art of microelectronics fabrication.

Figure 7:
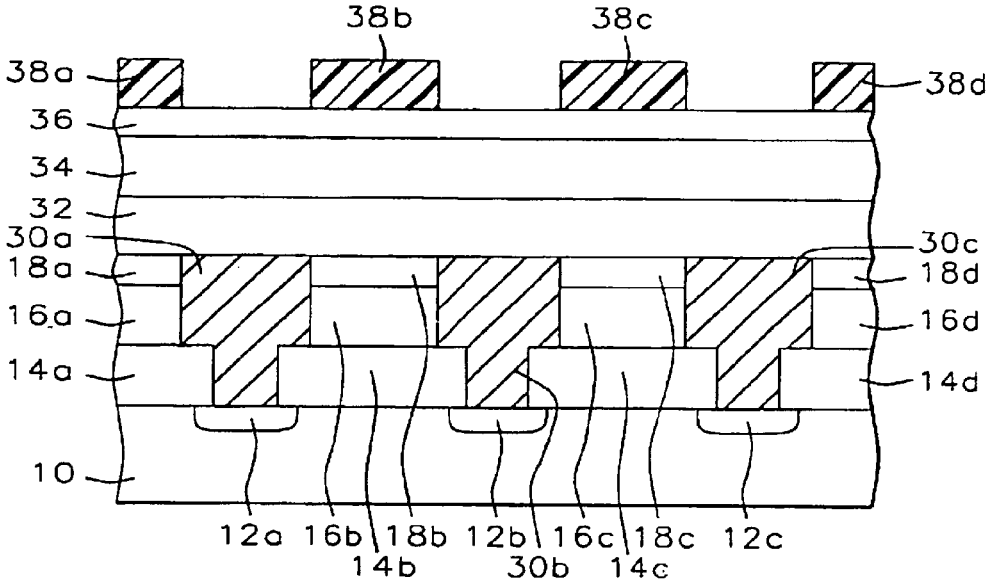

Referring now to FIG. 7, there is shown a schematic cross-sectional diagram illustrating the results of further processing of the microelectronics fabrication whose schematic cross-sectional diagram is illustrated in FIG. 6. Shown in FIG. 7 is a schematic cross-sectional diagram of a microelectronics fabrication otherwise equivalent to the microelectronics fabrication whose schematic cross-sectional diagram is illustrated in FIG. 6, but wherein: (1) there is formed upon the patterned hard mask layers 18a, 18b, 18c and 18d, and the patterned planarized contiguous conductor interconnection and contact stud layers 30a, 30b and 30c a blanket third dielectric layer 32; (2) there is formed upon the blanket third dielectric layer 32 a blanket fourth dielectric layer 34; (3) there is formed upon the blanket fourth dielectric layer 34 a blanket second hard mask layer 36; and (4) there is formed upon the blanket second hard mask layer 36 a series of pattern second photoresist layers 38a, 38b, 38c and 38d.

Within the preferred embodiment of the present invention, the blanket third dielectric layer 32 within the microelectronics fabrication whose schematic cross-sectional diagram is illustrated in FIG. 7 is preferably formed employing methods, materials and dimensions analogous or equivalent to the methods, materials and dimensions employed in forming the blanket first dielectric layer 14 as illustrated within the microelectronics fabrication whose schematic cross-sectional diagram is illustrated in FIG. 1. Similarly, within the preferred embodiment of the present invention, the blanket fourth dielectric layer 34 within the microelectronics fabrication whose schematic cross-sectional diagram is illustrated within FIG. 7 is preferably formed employing methods, materials and dimensions analogous or equivalent to the methods, materials and dimension employed in forming the blanket second dielectric layer 16 as illustrated within the microelectronics fabrication whose schematic cross-sectional diagram is illustrated in FIG. 1. Yet similarly, the blanket second hard mask layer 36 is illustrated within the microelectronics fabrication whose schematic cross-sectional diagram is illustrated in FIG. 7 is preferably formed employing methods, materials and dimensions analogous or equivalent to the methods, materials and dimensions employed in forming the blanket first hard mask layer 18 as illustrated within the microelectronics fabrication whose schematic cross-sectional diagram is illustrated in FIG. 1. Finally, the patterned second photoresist layers 38a, 38b, 38c and 38d as illustrated within the microelectronics fabrication whose schematic cross-sectional diagram is illustrated within FIG. 7 are preferably formed employing methods, materials and dimensions analogous or equivalent to the methods, materials and dimensions employed in forming the patterned first photoresist layers 20a, 20b, 20c and 20d as illustrated within the microelectronics fabrication whose schematic cross-sectional diagram is illustrated within FIG. 1.

Figure 8:
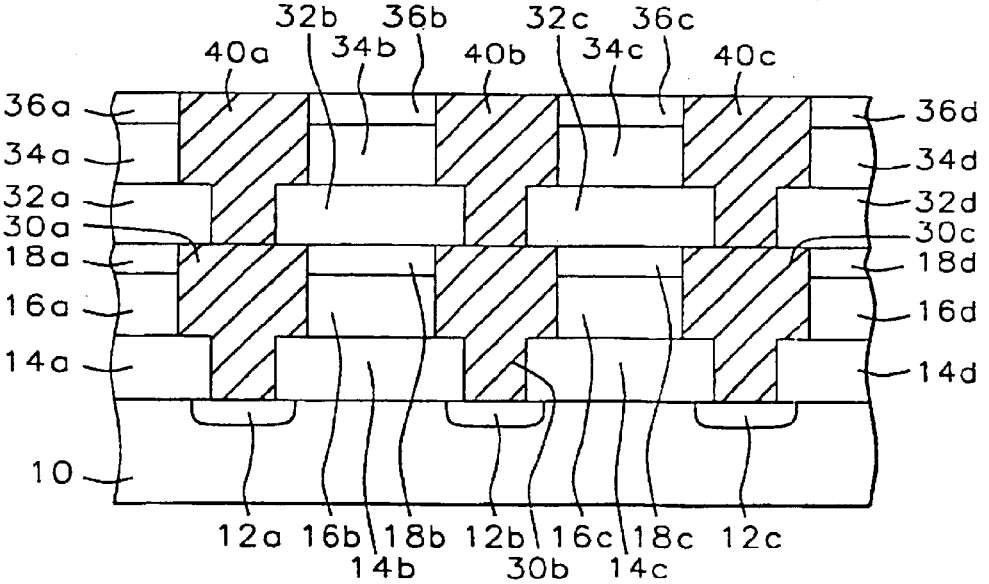

Referring now to FIG. 8, there is shown a schematic cross-sectional diagram illustrating the results of further processing of the microelectronics fabrication whose schematic cross-sectional diagram is illustrated in FIG. 7. Shown in FIG. 8 is a schematic cross-sectional diagram of a microelectronics fabrication otherwise equivalent to the microelectronics fabrication whose schematic cross-sectional diagram is illustrated in FIG. 7, but wherein: (1) there is formed from the blanket third dielectric layer 32 a series of patterned third dielectric layers 32a, 32b, 32c and 32d which define a series of second vias; (2) there is formed from the blanket fourth dielectric layer 34 a series of patterned fourth dielectric layers 34a, 34b, 34c and 34d which define a series of fourth trenches; (3) there is formed from the blanket second hard mask layer 36 a series of patterned second hard mask layers 36a, 36b, 36c and 36d which define a series of third trenches; and (4) there is formed into the series of second vias, third trenches and fourth trenches a series of patterned planarized contiguous conductor interconnection and interconnection stud layers 40a, 40b and 40c.

Within the preferred embodiment of the present invention, the microelectronics fabrication whose schematic cross-sectional diagram is illustrated in FIG. 8 is formed from the microelectronics fabrication whose schematic cross-sectional diagram is illustrated within FIG. 7 employing methods, materials and dimensions analogous or equivalent to the methods, materials and dimensions employed in forming the microelectronics fabrication whose schematic cross-sectional diagram is illustrated in FIG. 6 from the microelectronics fabrication whose schematic cross-sectional diagram is illustrated in FIG. 1. More preferably, although the patterned planarized contiguous conductor interconnection and interconnection stud layers 40a, 40b and 40c are formed employing a damascene method analogous or equivalent to the damascene method employed for forming the patterned planarized contiguous conductor interconnection and contact stud layers 30a, 30b and 30c as illustrated within the microelectronics fabrication whose schematic cross-sectional diagram is illustrated in FIG. 6, the patterned planarized contiguous conductor interconnection and interconnection stud layers 40a, 40b and 40c are preferably formed of an aluminum containing conductor material having formed therebelow a barrier layer rather than a tungsten containing conductor material having formed therebelow a barrier layer.

Upon forming the microelectronics fabrication whose schematic cross-sectional diagram is illustrated in FIG. 8, there is formed a microelectronics fabrication having formed therein two series of patterned planarized contiguous conductor interconnection and stud layers having interposed between the series of interconnection portions thereof two series of low dielectric constant dielectric layers, without employing a patterned hard mask layer interposed between the patterned low dielectric constant layers and a series of patterned lower dielectric layers which define a series of vias into which is formed the series of stud portions of the series of patterned planarized contiguous interconnection and stud layers. The microelectronics fabrication so formed is formed with attenuated process complexity.

As is understood by a person skilled in the art, the preferred embodiment of the present invention is illustrative of the present invention rather than limiting of the present invention. Revisions and modifications may be made to methods, materials, structures, and dimensions through which may be formed microelectronics fabrications in accord with the preferred embodiment of the present invention while still providing microelectronics fabrications formed in accord with the present invention, as defined by the appended claims.

What is claimed is:

1. A method for forming a via through a dielectric layer within a microelectronics fabrication comprising:

providing a substrate employed within a microelectronics fabrication, the substrate having a contact region formed therein;

forming upon the substrate and covering the contact region a blanket first dielectric layer, the blanket first dielectric layer being formed of a first dielectric material which is not susceptible to etching with an oxygen containing plasma;

forming upon the blanket first dielectric layer a blanket second dielectric layer, the blanket second dielectric layer being formed of a second dielectric material which is susceptible to etching within the oxygen containing plasma;

forming upon the blanket second dielectric layer a blanket hard mask layer, the blanket hard mask layer being formed from a hard mask material which is not susceptible to etching within the oxygen containing plasma;

forming upon the blanket hard mask layer a patterned first photoresist layer, the patterned first photoresist layer leaving exposed a portion of the blanket hard mask layer greater than and completely overlapping an areal deminsion of a via to be formed through the blanket first dielectric layer to access the contact layer;

etching, while employing a first plasma etch method, the blanket hard mask layer to form a patterned hard mask layer defining a first trench formed through the patterned hard mask layer while employing the patterned first photoresist layer as a first etch mask layer, the first plasma etch method employing a first etchant gas composition appropriate to the hard mask material from which is formed the blanket hard mask layer;

etching, while employing a second plasma etch method and at least the patterned hard mask layer as a second etch mask layer, the blanket second dielectric layer, and simultaneously stripping the patterned first photoresist layer, to form a patterned second dielectric layer having a second trench formed therethrough at a location corresponding with the first trench formed through the blanket hard mask layer, the second plasma etch method employing the oxygen containing plasma; the second plasma etch not etching the blanket first dielectric layer;

forming over at least the patterned second dielectric layer a patterned second photoresist layer which defines the location of the via to be formed through the blanket first dielectric layer, the areal deminsion of the via being contained within the areal deminsion of the second trench; and etching, while employing a third plasma etch method and the patterned second photoresist layer as a third etch mask layer, the via through the blanket first dielectric layer, the third plasma etch method employing a third etchant gas composition appropriate to the first dielectric material.

2. The method of claim 1 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

3. The method of claim 1 wherein the blanket first dielectric layer is formed from a silicon oxide dielectric material.

4. The method of claim 1 wherein the blanket second dielectric layer is formed from a dielectric material selected from the group consisting of organic polymer spin-on-polymer dielectric materials and amorphous carbon dielectric materials.

5. The method of claim 1 wherein there is not employed a hard mask layer interposed between the blanket first dielectric layer and the blanket second dielectric layer.

6. A method for forming a patterned conductor interconnection layer contacting a patterned conductor stud layer within a microelectronics fabrication comprising:

providing a substrate employed within a microelectronics fabrication, the substrate having a contact region formed therein;

forming upon the substrate and covering the contact region a blanket first dielectric layer, the blanket first dielectric layer being formed of a first dielectric material which is not susceptible to etching with an oxygen containing plasma;

forming upon the blanket first dielectric layer a blanket second dielectric layer, the blanket second dielectric layer being formed of a second dielectric material which is susceptible to etching within the oxygen containing plasma;

forming upon the blanket second dielectric layer a blanket hard mask layer, the blanket hard mask layer being formed from a hard mask material which is not susceptible to etching within the oxygen containing plasma;

forming upon the blanket hard mask layer a patterned first photoresist layer, the patterned first photoresist layer leaving exposed a portion of the blanket hard mask layer greater than and completely overlapping an areal deminsion of a via to be formed through the blanket first dielectric layer to access the contact layer;

etching, while employing a first plasma etch method, the blanket hard mask layer to form a patterned hard mask layer defining a first trench formed through the patterned hard mask layer while employing the patterned first photoresist layer as a first etch mask layer, the first plasma etch method employing a first etchant gas composition appropriate to the hard mask material from which is formed the blanket hard mask layer;

etching, while employing a second plasma etch method and at least the patterned hard mask layer as a second etch mask layer, the blanket second dielectric layer, and simultaneously stripping the patterned first photoresist layer, to form a patterned second dielectric layer having a second trench formed therethrough at a location corresponding with the first trench formed through the blanket hard mask layer, the second plasma etch method employing the oxygen containing plasma; the second plasma etch not etching the blanket first dielectric layer;

forming over at least the patterned second dielectric layer a patterned second photoresist layer which defines the location of the via to be formed through the blanket first dielectric layer, the areal deminsion of the via being contained within the areal deminsion of the second trench;

etching, while employing a third plasma etch method and the patterned second photoresist layer as a third etch mask layer, the via through the blanket first dielectric layer, the third plasma etch method employing a third etchant gas composition appropriate to the first dielectric material; and forming into at least the via and the second trench a patterned planarized contiguous conductor interconnection and stud layer.

7. The method of claim 6 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

8. The method of claim 6 wherein the blanket first dielectric layer is formed from a silicon oxide dielectric material.

9. The method of claim 6 wherein the blanket second dielectric layer is formed from a dielectric material selected from the group consisting of organic polymer spin-on-polymer dielectric materials and amorphous carbon dielectric materials.

10. The method of claim 6 wherein there is not employed a hard mask layer interposed between the blanket first dielectric layer and the blanket second dielectric layer.

11. The method of claim 6 wherein patterned planarized contiguous conductor interconnection and stud layer is formed employing a damascene method.

12. The method of claim 1, wherein the first etchant gas is a difluoromethane ($CH_2F_2$), hexafluoroethane ($C_2F_6$), octafluorocyclobutane ($C_4F_8$), argon and oxygen containing etchant gas composition.

13. The method of claim 1, wherein the first plasma etch method is conducted within a reactor chamber having a pressure form about 5 to 11 mTorr, a source radio frequency power of from about 500 to about 1000 watts at a radio frequency of 13.56 MHz, a bias power of from about 500 to about 1000 watts, a substrate temperature of from about 100 to about 200 degrees centigrade, a difluoromethane flow rate of from about 5 to about 15 sccm, a hexafluoroethane flow rate of from about 10 to about 20 sccm, an octafluorocyclobutane flow rate of from about 4 to about 10 sccm, an argon flow rate of from about 50 to about 150 sccm, and an oxygen flow rate of from about 3 to about 10 sccm.

14. The method of claim 6, wherein the first etchant gas is a difluoromethane ($CH_2F_2$), hexafluoroethane ($C_2F_6$), octafluorocyclobutane ($C_4F_8$), argon and oxygen containing etchant gas composition.

15. The method of claim 6, wherein the first plasma etch method is conducted within a reactor chamber having a pressure form about 5 to 11 mTorr, a source radio frequency power of from about 500 to about 1000 watts at a radio frequency of 13.56 MHz, a bias power of from about 500 to about 1000 watts, a substrate temperature of from about 100 to about 200 degrees centigrade, a difluoromethane flow rate of from about 5 to about 15 sccm, a hexafluoroethane flow rate of from about 10 to about 20 sccm, an octafluorocyclobutane flow rate of from about 4 to about 10 sccm, an argon flow rate of from about 50 to about 150 sccm, and an oxygen flow rate of from about 3 to about 10 sccm.

16. A method for forming a via through a dielectric layer within a microelectronics fabrication comprising:

providing a substrate employed within a microelectronics fabrication, the substrate having a contact region formed therein;

forming upon the substrate and covering the contact region a blanket first dielectric layer, the blanket first dielectric layer being formed of a first dielectric material which is not susceptible to etching with an oxygen containing plasma; the blanket first dielectric layer being formed from a silicon oxide dielectric material;

forming upon the blanket first dielectric layer a blanket second dielectric layer, the blanket second dielectric layer being formed of a second dielectric material which is susceptible to etching within the oxygen containing plasma; the blanket second dielectric layer being formed from a dielectric material selected from the group comprising organic polymer spin-on-polymer dielectric materials and amorphous carbon dielectric materials;

forming upon the blanket second dielectric layer a blanket hard mask layer, the blanket hard mask layer being formed from a hard mask material which is not susceptible to etching within the oxygen containing plasma;

forming upon the blanket hard mask layer a patterned first photoresist layer, the patterned first photoresist layer leaving exposed a portion of the blanket hard mask layer greater than and completely overlapping an areal deminsion of a via to be formed through the blanket first dielectric layer to access the contact layer;

etching, while employing a first plasma etch method, the blanket hard mask layer to form a patterned hard mask layer defining a first trench formed through the patterned hard mask layer while employing the patterned first photoresist layer as a first etch mask layer, the first plasma etch method employing a first etchant gas composition appropriate to the hard mask material from which is formed the blanket hard mask layer;

etching, while employing a second plasma etch method and at least the patterned hard mask layer as a second etch mask layer, the blanket second dielectric layer, and simultaneously stripping the patterned first photoresist layer, to form a patterned second dielectric layer having a second trench formed therethrough at a location corresponding with the first trench formed through the blanket hard mask layer, the second plasma etch method employing the oxygen containing plasma; the second plasma etch not etching the blanket first dielectric layer;

forming over at least the patterned second dielectric layer a patterned second photoresist layer which defines the location of the via to be formed through the blanket first dielectric layer, the areal deminsion of the via being contained within the areal deminsion of the second trench; and etching, while employing a third plasma etch method and the patterned second photoresist layer as a third etch mask layer, the via through the blanket first dielectric layer, the third plasma etch method employing a third etchant gas composition appropriate to the first dielectric material.

17. The method of claim 16 wherein the microelectronics fabrication is selected from the group consisting of semiconductor integrated circuit microelectronics fabrications, solar cell microelectronics fabrications, ceramic substrate microelectronics fabrications and flat panel display microelectronics fabrications.

18. The method of claim 16 wherein there is not employed a hard mask layer interposed between the blanket first dielectric layer and the blanket second dielectric layer.

19. The method of claim 16, wherein the first etchant gas is a difluoromethane ($CH_2F_2$), hexafluoroethane ($C_2F_6$), octafluorocyclobutane ($C_4F_8$), argon and oxygen containing etchant gas composition.

20. The method of claim 16, wherein the first plasma etch method is conducted within a reactor chamber having a pressure form about 5 to 11 mTorr, a source radio frequency power of from about 500 to about 1000 watts at a radio frequency of 13.56 MHz, a bias power of from about 500 to about 1000 watts, a substrate temperature of from about 100 to about 200 degrees centigrade, a difluoromethane flow rate of from about 5 to about 15 sccm, a hexafluoroethane flow rate of from about 10 to about 20 sccm, an octafluorocyclobutane flow rate of from about 4 to about 10 sccm, an argon flow rate of from about 50 to about 150 sccm, and an oxygen flow rate of from about 3 to about 10 sccm.

*21. A method comprising:*

*forming an arrangement which includes a substrate, a first dielectric layer overlying the substrate, a second dielectric layer overlying the first dielectric layer, and a patterned first photoresist layer overlying the second dielectric layer;*

*etching the second dielectric layer in a plasma chemistry that simultaneously strips the first photoresist layer, the first dielectric layer being free of susceptibility to etching by the plasma chemistry; and*

*forming over the second dielectric layer a patterned second photoresist layer that defines the location of a via which is to be formed in the first dielectric layer.*

*22. A method according to claim 21, including before the etching of the second dielectric layer;*

*forming above the second dielectric layer a hard mask layer which is not susceptible to etching by the plasma chemistry;*

*forming the patterned first photoresist layer over the hard mask layer; and*

*etching the hard mask layer through the first photoresist layer according to the pattern of the first photoresist layer.*

*23. A method according to claim 22, wherein the etching of the second dielectric layer includes etching therein a trench which has a portion overlying the location where the via is to be formed.*

*24. A method according to claim 21, including selecting as the the plasma chemistry an oxygen-containing plasma chemistry.*

*25. A method according to claim 21, including after the forming of the second photoresist layer;*

*etching the first dielectric layer through the second photoresist layer according to the pattern of the second photoresist layer in order to form the via through the first dielectric layer.*

*26. A method according to claim 25, including forming on the substrate a circuit which has a contact, the via exposing at its lower end a surface portion on the contact.*

*27. A method according to claim 21, including forming the second dielectric layer on the first dielectric layer.*

*28. A method according to claim 21, including selecting for the first dielectric layer a material which is one of silicon oxide, silicon nitride and silicon oxynitride.*

*29. A method according to claim 21, including forming the first dielectric layer using one of a chemical vapor deposition technique, a plasma enhanced chemical vapor deposition technique, and a physical vapor deposition technique.*

*30. A method according to claim 21, including selecting for the second dielectric layer an organic material.*

*31. A method according to claim 21, including selecting for the second dielectric layer a material which is one of an organic polymer spin-on-polymer dielectric material and an amorphous carbon dielectric material.*

*32. A method according to claim 21, including selecting for the second dielectric layer a material which is one of a polyimide organic polymer spin-on-polymer dielectric material, a poly-arylene-ether organic polymer spin-on-polymer dielectric material, a fluorinated poly-arylene-ether organic polymer spin-on-polymer dielectric material, an amorphous carbon dielectric material, and a fluorinated amorphous carbon dielectric material.*

*33. A method according to claim 21, including:*

*selecting for the first dielectric layer a material having a first dielectric constant; and*

*selecting for the second dielectric layer a material having a second dielectric constant less than the first dielectric constant.*

*34. A method according to claim 21, including selecting for the second dielectric layer a material having a dielectric constant less than about 3.0.*

* * * * *